United States Patent
Kato et al.

(10) Patent No.: US 9,293,799 B2
(45) Date of Patent: Mar. 22, 2016

(54) HIGH FREQUENCY SIGNAL LINE AND ELECTRONIC DEVICE

(71) Applicant: Murata Manufacturing Co., Ltd., Nagaokakyo-shi, Kyoto-fu (JP)

(72) Inventors: Noboru Kato, Nagaokakyo (JP); Masahiro Ozawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 213 days.

(21) Appl. No.: 14/196,329

(22) Filed: Mar. 4, 2014

(65) Prior Publication Data

US 2014/0184361 A1 Jul. 3, 2014

Related U.S. Application Data

(63) Continuation of application No. PCT/JP2012/082191, filed on Dec. 12, 2012.

(30) Foreign Application Priority Data

Dec. 29, 2011 (JP) .................................. 2011-290251

(51) Int. Cl.
*H01P 3/08* (2006.01)
*H05K 1/02* (2006.01)

(52) U.S. Cl.
CPC *H01P 3/082* (2013.01); *H01P 3/08* (2013.01); *H05K 1/0253* (2013.01); *H05K 1/0227* (2013.01); *H05K 2201/09263* (2013.01); *H05K2201/09618* (2013.01); *H05K 2201/09727* (2013.01)

(58) Field of Classification Search
CPC ....................................................... H01P 3/08

USPC ............................................. 333/238, 246, 33
See application file for complete search history.

(56) References Cited

U.S. PATENT DOCUMENTS

| | | | | |
|---|---|---|---|---|
| 5,479,138 A | * | 12/1995 | Kuroda | H01P 3/088 333/1 |
| 2002/0084876 A1 | * | 7/2002 | Wright | H01P 3/081 333/238 |
| 2014/0048312 A1 | | 2/2014 | Kato et al. | |

FOREIGN PATENT DOCUMENTS

| | | |
|---|---|---|
| JP | 09-283867 A | 10/1997 |
| JP | 2007-123740 A | 5/2007 |
| JP | 2010-187141 A | 8/2010 |
| WO | 2011/007660 A1 | 1/2011 |

OTHER PUBLICATIONS

Official Communication issued in International Patent Application No. PCT/JP2012/082191, mailed on Feb. 12, 2013.

* cited by examiner

*Primary Examiner* — Stephen E Jones
(74) *Attorney, Agent, or Firm* — Keating & Bennett, LLP

(57) ABSTRACT

A dielectric element assembly includes a plurality of stacked dielectric sheets. A signal line is provided in or on the dielectric element assembly. A ground conductor is provided in or on the dielectric element assembly on the negative direction side of a z-axis direction relative to the signal line and is arranged so as to oppose the signal line via the dielectric sheets. The ground conductor includes a main body portion and protruding portions. The main body portion extends along the signal line on one side of a direction perpendicular or substantially perpendicular to the signal line relative to the signal line when viewed in plan from the z-axis direction. The protruding portions protrude from the main body portion toward the signal line and overlap the signal line when viewed in plan from the z-axis direction.

12 Claims, 17 Drawing Sheets

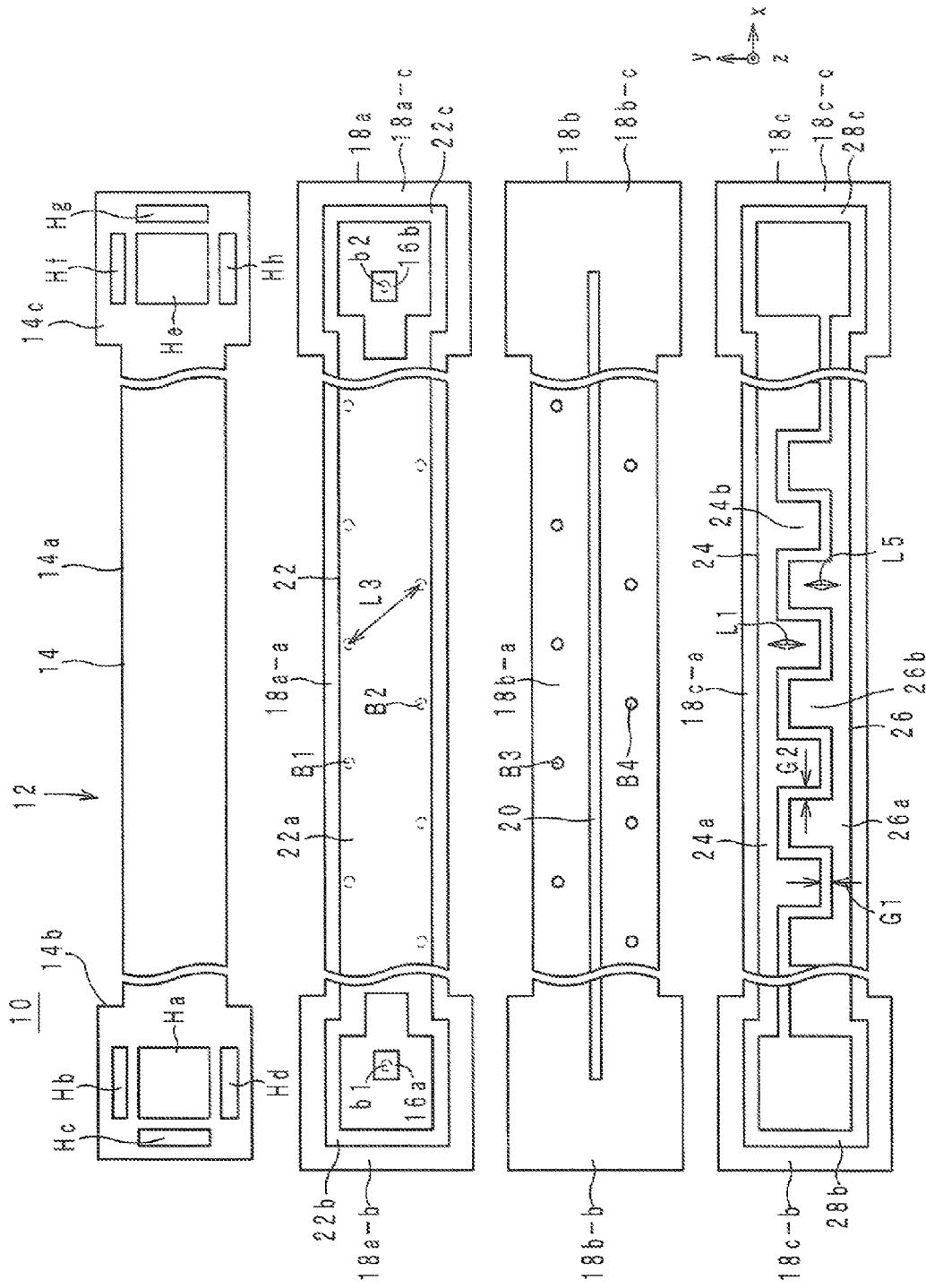

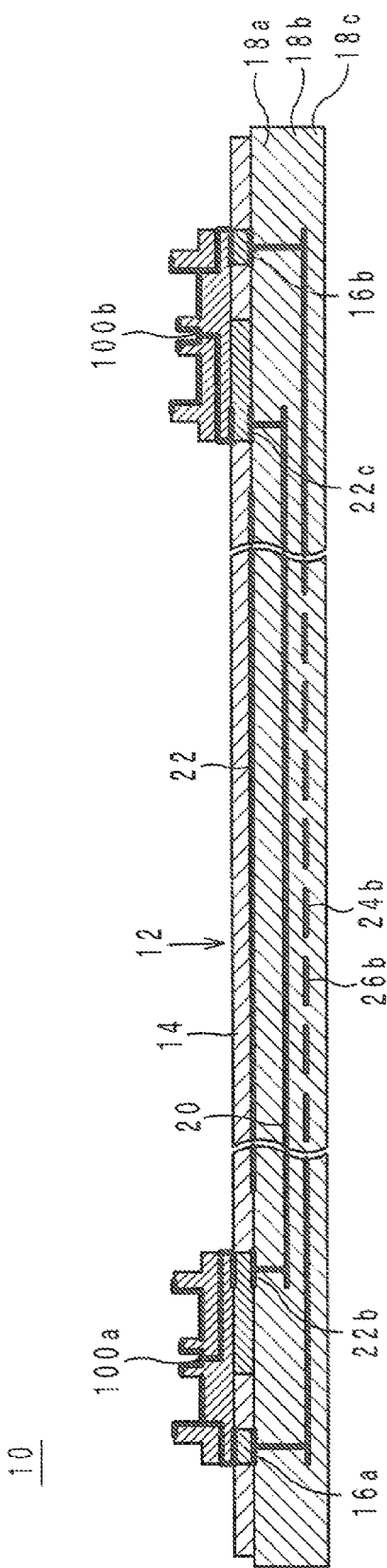

HIGH FREQUENCY SIGNAL LINE AND ELECTRONIC DEVICE

This application is based on Japanese Patent Application No. 2011-290251 filed on Dec. 29, 2011 and PCT/JP2012/082191 filed on Dec. 12, 2012, the entire contents of which are incorporated herein by reference.

BACKGROUND OF THE INVENTION

1. Field of the Invention

The present invention relates to a high frequency signal line and an electronic device, and more specifically relates to a high frequency signal line in which a signal line is provided on a element assembly including stacked insulator layers, and an electronic device.

2. Description of Related Art

In a high frequency signal line which has a triplate-type strip line structure in which a signal line is vertically sandwiched by ground conductors, the line width of the signal line is increased in order to reduce high frequency transmission loss of the signal line. Accordingly, the surface area of the signal line increases, and the area of a portion of the ground conductors facing on the signal line increases. As a result, the high frequency transmission loss of the signal line decreases. The high frequency transmission loss refers to a loss which is mainly caused by transition of a high frequency signal to heat in an impedance matched state.

However, as the line width of the signal line increases, the area of a region where the signal line and the ground conductors face each other increases, so that the electrostatic capacitance generated between the signal line and the ground conductors increases. Therefore, in order to make the characteristic impedance of the high frequency signal line equal to a predetermined characteristic impedance (e.g., 50Ω), it is necessary to increase the distance between the signal line and the ground conductors such that the electrostatic capacitance therebetween is reduced. However, as the distance between the signal line and the ground conductors increases, the thickness of the high frequency signal line increases.

In view of such a problem, a flexible substrate described in Japanese Laid-Open Publication No. 2007-123740 has been proposed. FIG. 16 is a view of a flexible substrate 600 described in Japanese Laid-Open Publication No. 2007-123740, which is viewed in plan from the layer-stacking direction.

The flexible substrate 600 includes a signal line 602 and a ground layer 604. The signal line 602 is a linear conductor. The ground layer 604 is stacked on the upper side of the signal line 602 in terms of the layer-stacking direction via a dielectric layer. Although not shown, another ground layer is provided on the lower side of the signal line 602 in terms of the layer-stacking direction. In the flexible substrate 600, the ground layer 604 has a plurality of openings 606. The openings 606 have a rectangular shape and are aligned in a row on the signal line 602 along the extending direction of the signal line 602. Therefore, when viewed in plan from the upper side of the layer-stacking direction, the signal line 602 partially overlaps the ground layer 604. As a result, the electrostatic capacitance generated between the signal line 602 and the ground layer 604 decreases. Thus, the distance between the signal line 602 and the ground layer 604 can be reduced, and the thickness of the flexible substrate 600 can be reduced.

However, the flexible substrate 600 described in Japanese Laid-Open Publication No. 2007-123740 has a problem in that reducing the thickness of the flexible substrate 600 is still difficult as described below. FIG. 17 is an equivalent circuit diagram of the signal line 602 and the ground layer 604.

In the flexible substrate 600, when a high frequency signal flows through the signal line 602, electric currents i1, i2 flow through bridge portions 608 lying between the openings 606 of the ground layer 604 due to electromagnetic induction as shown in FIG. 16. The electric currents i1, i2 flow in mutually opposite directions from a center of the bridge portions 608 in terms of the right-left direction. Here, the ground layer 604 of the flexible substrate 600 has a circuit configuration shown in FIG. 17. More specifically, the right half of the bridge portions 608 forms an inductor component L11, and the left half of the bridge portions 608 forms an inductor component L12. Also, a capacitor component C10 is formed between the signal line 602 and the ground layer 604. When the electric current i1 flows through the inductor component L11 and the electric current i2 flows through the inductor component L12, a magnetic field produced by the inductor component L11 and a magnetic field produced by the inductor component L12 cancel each other because the direction of the electric current i1 and the direction of the electric current i2 are opposite to each other. As a result, in the equivalent circuit diagram shown in FIG. 17, the inductor components L11, L12 are not present, or the inductor components significantly decrease. Therefore, the characteristic impedance of a portion of the signal line 602 overlapping the bridge portions 608 is such that the capacitor component C10 is dominant, and the characteristic impedance of that portion is lower than a predetermined characteristic impedance. In view of the foregoing, in the flexible substrate 600 described in Japanese Laid-Open Publication No. 2007-123740, it is necessary to increase the distance between the signal line 602 and the ground layer 604. Thus, it is difficult to reduce the thickness of the flexible substrate 600.

SUMMARY OF THE INVENTION

In view of the foregoing, preferred embodiments of the present invention provide a high frequency signal line and an electronic device in which the thickness of the high frequency signal line is significantly reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is an exploded view of a dielectric element assembly of the high frequency signal line of FIG. 1.

FIG. 3 is a cross-sectional configuration diagram of the high frequency signal line of FIG. 1.

DETAILED DESCRIPTION OF THE PREFERRED EMBODIMENTS

Hereinafter, a high frequency signal line and an electronic device according to preferred embodiments of the present invention are described with reference to the drawings.

Figure 1:
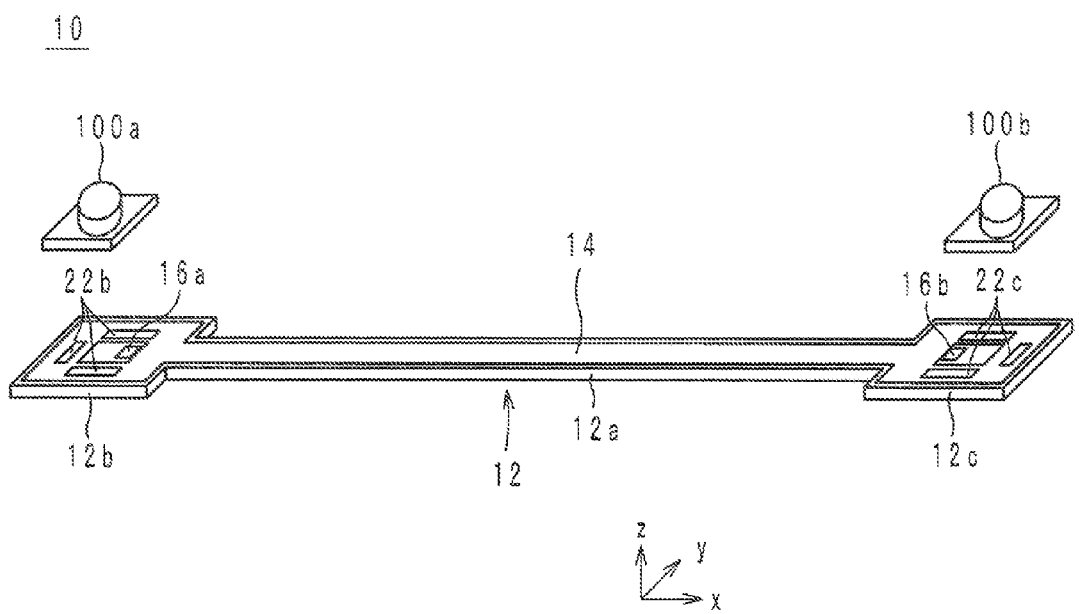
FIG. 1 is an exterior perspective view of a high frequency signal line according to a preferred embodiment of the present invention.
Figure 4A:
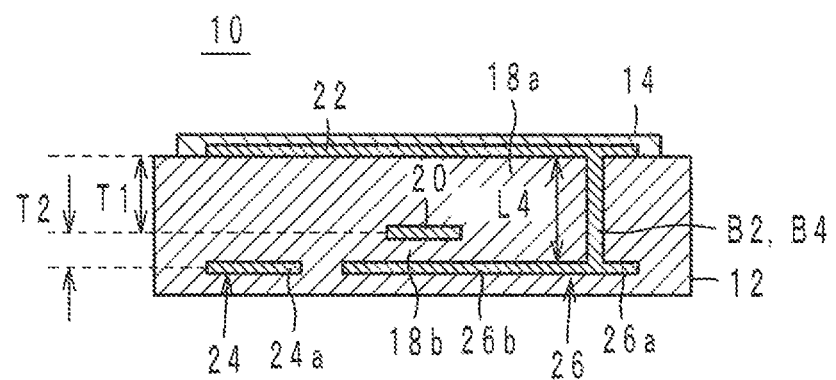
FIGS. 4A and 4B are cross-sectional configuration diagrams of the high frequency signal line.
Figure 4B:
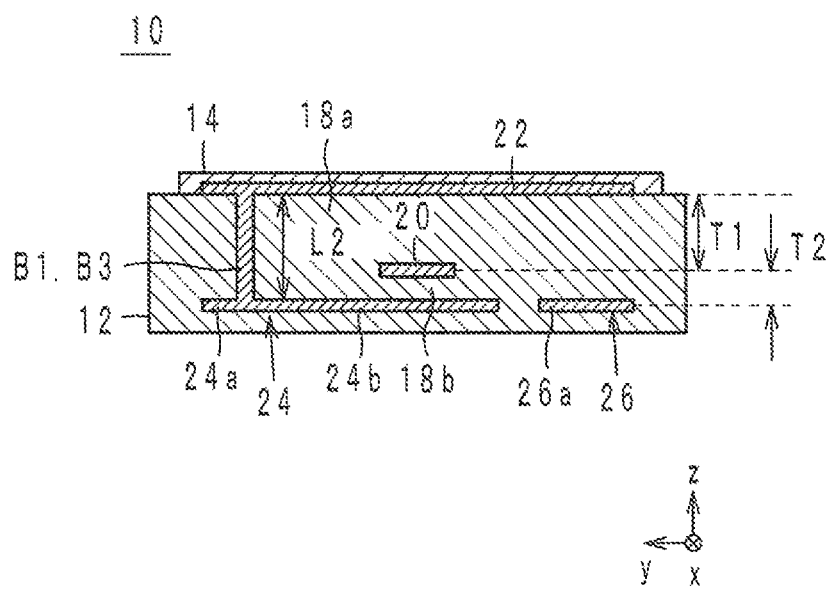
Figure 5A:
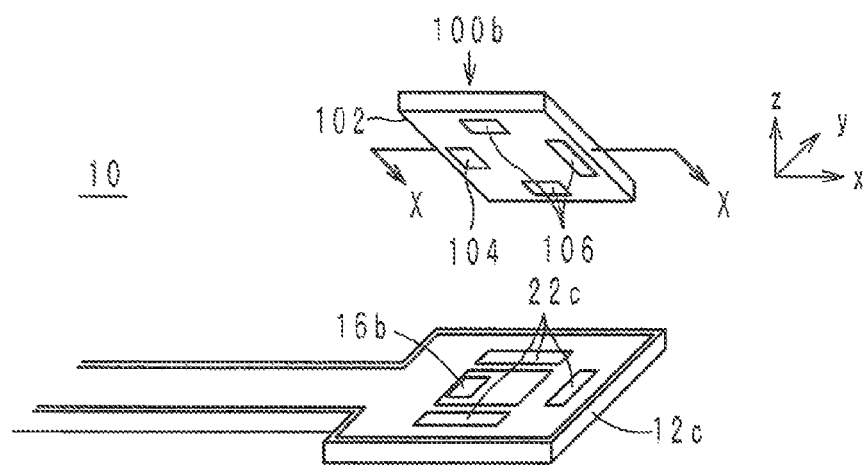
FIGS. 5A and 5B show an exterior perspective view and a cross-sectional configuration view of a connector of a high frequency signal line.
Figure 5B:
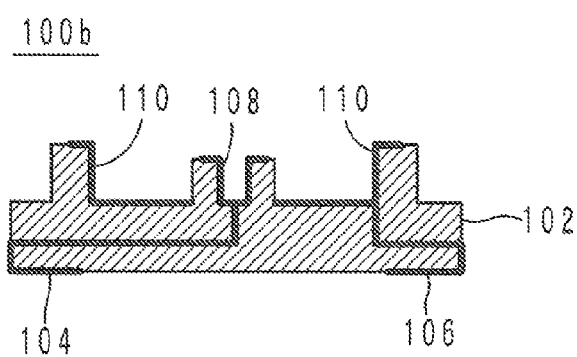

Hereinafter, the configuration of a high frequency signal line according to a preferred embodiment of the present invention is described with reference to the drawings. FIG. 1 is an exterior perspective view of a high frequency signal line 10 according to a preferred embodiment of the present invention. FIG. 2 is an exploded view of a dielectric element assembly 12 of the high frequency signal line 10 of FIG. 1. FIG. 3 is a cross-sectional configuration diagram of the high frequency signal line 10 of FIG. 1. FIG. 4 is a cross-sectional configuration diagram of the high frequency signal line 10. FIG. 5 shows an exterior perspective view and a cross-sectional configuration view of a connector 100b of a high frequency signal line 10. In FIG. 1 through FIG. 5, the layer-stacking direction of the high frequency signal line 10 is defined as the z-axis direction. The longitudinal direction of the high frequency signal line 10 is defined as the x-axis direction. A direction which is perpendicular to the x-axis direction and the z-axis direction is defined as the y-axis direction.

The high frequency signal line 10 is preferably used in, for example, an electronic device such as a mobile phone, for coupling two high frequency circuits. The high frequency signal line 10 includes, as shown in FIG. 1 through FIG. 3, a dielectric element assembly 12, external terminals 16 (16a, 16b), a signal line 20, ground conductors 22, 24, 26, terminal portions 28b, 28c, via hole conductors b1, b2, B1 to B4, and connectors 100a, 100b.

The dielectric element assembly 12 extends in the x-axis direction when viewed in plan from the z-axis direction and includes a line portion 12a, and connecting portions 12b, 12c. The dielectric element assembly 12 is a multilayer body that includes a protection layer 14 and dielectric sheets (insulator layers) 18 (18a to 18c) shown in FIG. 2, which are stacked in this order from the positive direction side to the negative direction side of the z-axis direction. In the following description, a principal surface of the dielectric element assembly 12 which is on the positive direction side of the z-axis direction is referred to as "front surface (first principal surface)", and the other principal surface of the dielectric element assembly 12 which is on the negative direction side of the z-axis direction is referred to as "rear surface (second principal surface)".

The line portion 12a extends in the x-axis direction. The connecting portions 12b, 12c are respectively connected with an end of the line portion 12a which is on the negative direction side of the x-axis direction and the other end of the line portion 12a which is on the positive direction side of the x-axis direction. The connecting portions 12b, 12c preferably have a rectangular or substantially rectangular shape. The width in the y-axis direction of the connecting portions 12b, 12c is greater than the width in the y-axis direction of the line portion 12a.

The dielectric sheets 18 extend in the x-axis direction and have the same shape as the dielectric element assembly 12 when viewed in plan from the z-axis direction. The dielectric sheets 18 are made of a thermoplastic resin which has flexibility, such as polyimide, a liquid crystal polymer, or the like. The thickness T1 of the dielectric sheet 18a is greater than the thickness T2 of the dielectric sheet 18b as shown in FIG. 4. For example, after the dielectric sheets 18a to 18c have been stacked, the thickness T1 preferably is about 50 to about 300 μm. In the present preferred embodiment, the thickness T1 preferably is about 150 μm, for example. The thickness T2 preferably is about 10 μm to about 100 μm, for example. In the present preferred embodiment, the thickness T2 preferably is about 50 μm. Hereinafter, a principal surface of the dielectric sheets 18 which is on the positive direction side of the z-axis direction is referred to as "front surface", and the other principal surface of the dielectric sheets 18 which is on the negative direction side of the z-axis direction is referred to as "rear surface".

The dielectric sheet 18a includes a line portion 18a-a and connecting portions 18a-b, 18a-c. The dielectric sheet 18b includes a line portion 18b-a and connecting portions 18b-b, 18b-c. The dielectric sheet 18c includes a line portion 18c-a and connecting portions 18c-b, 18c-c. The line portions 18a-a, 18b-a, 18c-a define the line portion 12a. The connecting portions 18a-b, 18b-b, 18c-b define the connecting portion 12b. The connecting portions 18a-c, 18b-c, 18c-c define the connecting portion 12c.

The external terminal 16a is a rectangular or substantially rectangular conductor which is provided near the center of the front surface of the connecting portion 18a-b as shown in FIG. 1 and FIG. 2. The external terminal 16b is a rectangular or substantially rectangular conductor which is provided near the center of the front surface of the connecting portion 18a-c as shown in FIG. 1 and FIG. 2. The external terminals 16a, 16b are made of a metal material whose major constituent is silver or copper and which has small specific resistance. Further, the surface of the external terminals 16a, 16b preferably is plated with gold.

The signal line 20 is a linear conductor which is provided in the dielectric element assembly 12 as shown in FIG. 2. The signal line 20 extends in the x-axis direction on the front surface of the dielectric sheet 18b. Both ends of the signal line 20 overlap the external terminals 16a, 16b, respectively, when viewed in plan from the z-axis direction. The signal line 20 is made of a metal material whose major constituent is silver or copper and which has small specific resistance.

The ground conductor 22 is provided on the front surface of the dielectric sheet 18a. Accordingly, as shown in FIG. 3, the ground conductor 22 is provided on the positive direction side of the z-axis direction relative to the signal line 20 and is arranged so as to oppose the signal line 20 via the dielectric sheet 18a.

More specifically, the ground conductor 22 includes a line portion 22a and terminal portions 22b, 22c. The line portion 22a is provided on the front surface of the line portion 18a-a so as to extend in the x-axis direction. The terminal portion 22b is provided on the front surface of the connecting portion 18a-b so as to define a rectangular or substantially rectangular ring surrounding the external terminal 16a. The terminal portion 22b is connected with an end of the line portion 22a which is on the negative direction side of the x-axis direction. The terminal portion 22c is provided on the front surface of the connecting portion 18a-c so as to define a rectangular or substantially rectangular ring surrounding the external terminal 16b. The terminal portion 22c is connected with the other end of the line portion 22a which is on the positive direction side of the x-axis direction. The ground conductor 22 is made of a metal material whose major constituent is silver or copper and which has small specific resistance.

Here, the characteristic impedance of the high frequency signal line 10 is mainly determined based on the opposing area and distance between the signal line 20 and the ground conductor 22 and the relative permittivity of the dielectric sheets 18a to 18c. In view of such, in the case where the characteristic impedance of the high frequency signal line 10 is preferably set to 50Ω, for example, the high frequency signal line 10 is designed such that the signal line 20 and the ground conductor 22 cause the characteristic impedance of the high frequency signal line 10 to be 55Ω, for example, which is somewhat higher than 50Ω. And, the shape of the ground conductor 24, which will be described later, is adjusted such that the signal line 20, the ground conductor 22, and the ground conductor 24 cause the characteristic impedance of the high frequency signal line 10 to be 50Ω, for example. As described hereinabove, the ground conductor 22 serves as a reference ground conductor.

The ground conductor 24 is provided on the front surface of the dielectric sheet 18c. Accordingly, as shown in FIG. 3, the ground conductor 24 is provided on the negative direction side of the z-axis direction relative to the signal line 20 and is arranged so as to oppose the signal line 20 via the dielectric sheet 18b.

More specifically, the ground conductor 24 includes a main body portion 24a and a plurality of protruding portions 24b. The main body portion 24a is a rectangular or substantially rectangular conductor extending in the x-axis direction along the signal line 20 on the positive direction side of the y-axis direction (a direction perpendicular to the signal line 20) when viewed in plan from the z-axis direction. The main body portion 24a does not overlap the signal line 20 when viewed in plan from the z-axis direction.

The plurality of protruding portions 24b are rectangular or substantially rectangular conductors that are arranged so as to protrude from a long side of the main body portion 24a which is on the negative direction side of the y-axis direction toward the negative direction side of the y-axis direction (i.e., toward the signal line 20) and so as to overlap the signal line 20 when viewed in plan from the z-axis direction. The plurality of protruding portions 24b are arranged in the x-axis direction at equal intervals. Accordingly, the ground conductor 24 overlaps portions of the signal line 20 at the protruding portions 24b. The ground conductor 24 is made of a metal material whose major constituent is silver or copper and which has small specific resistance.

The ground conductor 26 is provided on the front surface of the dielectric sheet 18c. Accordingly, as shown in FIG. 3, the ground conductor 24 is provided on the negative direction side of the z-axis direction relative to the signal line 20 and is arranged so as to oppose the signal line 20 via the dielectric sheet 18b.

More specifically, the ground conductor 26 includes a main body portion 26a and a plurality of protruding portions 26b. The main body portion 26a is a rectangular or substantially rectangular conductor extending in the x-axis direction along the signal line 20 on the negative direction side of the y-axis direction (a direction perpendicular to the signal line 20) when viewed in plan from the z-axis direction. The main body portion 26a does not overlap the signal line 20 when viewed in plan from the z-axis direction. The ground conductor 26 is made of a metal material whose major constituent is silver or copper and which has small specific resistance.

The plurality of protruding portions 26b are rectangular or substantially rectangular conductors that are arranged so as to protrude from a long side of the main body portion 26a which is on the positive direction side of the y-axis direction toward the positive direction side of the y-axis direction (i.e., toward the signal line 20) and so as to overlap the signal line 20 when viewed in plan from the z-axis direction. The plurality of protruding portions 26b are arranged in the x-axis direction at equal intervals. Accordingly, the ground conductor 26 overlaps portions of the signal line 20 at the protruding portions 26b.

The protruding portions 24b, 26b are arranged alternately in the x-axis direction along the signal line 20. Note that, however, the protruding portions 24b are not connected with the other conductors and are not connected with the ground conductor 26. The protruding portions 26b are not connected with the other conductors and are not connected with the ground conductor 24. Accordingly, there is a gap between the ground conductor 24 and the ground conductor 26. This gap preferably has a zigzag shape such that extends in the x-axis direction with oscillations in the y-axis direction as shown in FIG. 2. The signal line 20 overlaps the protruding portions 24b, 26b and also overlaps the gap. It is preferred that the width G1 of a portion of the gap extending in the x-axis direction is smaller than the width G2 of a portion of the gap extending in the y-axis direction.

The ground conductors 24, 26 are auxiliary ground conductors which also function as shields. As previously described, the ground conductors 24, 26 are designed for a final adjustment which is carried out such that the characteristic impedance of the high frequency signal line 10 is 50Ω or about 50Ω, for example. Further, the width of the gap between the ground conductors 24, 26 is designed so as not to produce radiation noise within a used band.

The terminal portion 28b is provided on the front surface of the connecting portion 18c-b and has generally the same shape as the terminal portion 22b. The terminal portion 28b is connected with ends of the ground conductors 24, 26 which are on the negative direction side of the x-axis direction. The terminal portion 28c is provided on the front surface of the line portion 18c-c and has generally the same shape as the terminal portion 22c. The terminal portion 28c is connected with ends of the ground conductors 24, 26 which are on the positive direction side of the x-axis direction. The terminal portions 28b, 28c are made of a metal material whose major constituent is silver or copper and which has small specific resistance.

The via hole conductor b1 penetrates through the connecting portion 18a-b of the dielectric sheet 18a in the z-axis direction and couples the external terminal 16a to an end of the signal line 20 which is on the negative direction side of the x-axis direction. The via hole conductor b2 penetrates through the connecting portion 18a-c of the dielectric sheet 18a in the z-axis direction and couples the external terminal 16b to the other end of the signal line 20 which is on the positive direction side of the x-axis direction. Accordingly, the signal line 20 is connected between the external terminals 16a, 16b. The via hole conductors b1, b2 are made of a metal material whose major constituent is silver or copper and which has small specific resistance.

The plurality of via hole conductors B1 penetrate through the line portion 18a-a of the dielectric sheet 18a in the z-axis direction and are aligned in a row at equal intervals in the line portion 18a-a. When viewed in plan from the z-axis direction, the via hole conductors B1 are provided on the positive direction side of the y-axis direction (a direction perpendicular to the signal line 20) relative to the protruding portions 24b. The plurality of via hole conductors B3 penetrate through the line portion 18b-a of the dielectric sheet 18b in the z-axis direction and are aligned in a row at equal intervals in the line portion 18b-a. When viewed in plan from the z-axis direction, the via hole conductors B3 are provided on the positive direction side of the y-axis direction (a direction perpendicular to the signal line 20) relative to the protruding portions 24b. The via hole conductors B1, B3 are joined together to define a single via hole conductor, which connects the ground conductor 22 to the main body portion 24a of the ground conductor 24. The via hole conductors B1, B3 are made of a metal material whose major constituent is silver or copper and which has small specific resistance.

The plurality of via hole conductors B2 penetrate through the line portion 18a-a of the dielectric sheet 18a in the z-axis direction and are aligned in a row at equal intervals in the line portion 18a-a. When viewed in plan from the z-axis direction, the via hole conductors B2 are provided on the negative direction side of the y-axis direction (a direction perpendicular to the signal line 20) relative to the protruding portions 26b. The plurality of via hole conductors B4 penetrate through the line portion 18b-a of the dielectric sheet 18b in the z-axis direction and are aligned in a row at equal intervals in the line portion 18b-a. When viewed in plan from the z-axis direction, the via hole conductors B4 are provided on the negative direction side of the y-axis direction (a direction perpendicular to the signal line 20) relative to the protruding portions 26b. The via hole conductors B2, B4 are joined together to define a single via hole conductor, which connects the ground conductor 22 to the main body portion 26a of the ground conductor 26. The via hole conductors B2, B4 are made of a metal material whose major constituent is silver or copper and which has small specific resistance.

In the high frequency signal line 10 that has the above-described configuration, the distance in the z-axis direction between the signal line 20 and the ground conductor 22 is generally equal to the thickness T1 of the dielectric sheet 18a as shown in FIG. 4, which is, for example, about 50 μm to about 300 μm. In the present preferred embodiment, the distance in the z-axis direction between the signal line 20 and the ground conductor 22 preferably is about 150 μm, for example. On the other hand, the distance in the z-axis direction between the signal line 20 and the ground conductors 24, 26 is equal or substantially equal to the thickness T2 of the dielectric sheet 18b as shown in FIG. 4, which is, for example, about 10 μm to about 100 μm. In the present preferred embodiment, the distance in the z-axis direction between the signal line 20 and the ground conductors 24, 26 is 50 μm. That is, the high frequency signal line 10 is designed such that the distance in the z-axis direction between the signal line 20 and the ground conductor 22 is greater than the distance in the z-axis direction between the signal line 20 and the ground conductors 24, 26.

Further, in the high frequency signal line 10, the total of the distance L1 from a portion where the signal line 20 and the protruding portions 24b overlap each other to the via hole conductors B1, B3, the length L2 of the via hole conductors B1, B3, the distance L3 from the via hole conductors B1, B3 to the via hole conductors B2, B4, the length L4 of the via hole conductors B2, B4, and the distance L5 from the via hole conductors B2, B4 to a portion where the signal line 20 and the protruding portions 26b that are adjacent to the protruding portions 24b overlap each other is equal or substantially equal to ¼ of the wavelength of a high frequency signal transmitted through the signal line 20.

The protection layer 14 covers generally the entire front surface of the dielectric sheet 18a. With this arrangement, the protection layer 14 covers the ground conductor 22. The protection layer 14 is made of a flexible resin, such as a resist material, for example.

The protection layer 14 includes a line portion 14a and connecting portions 14b, 14c as shown in FIG. 2. The line portion 14a covers the entire front surface of the line portion 18a-a, thereby covering the line portion 22a.

The connecting portion 14b is connected with an end of the line portion 14a which is on the negative direction side of the x-axis direction and covers the front surface of the connecting portion 18a-b. Note that, however, the connecting portion 14b includes openings Ha to Hd. The opening Ha is a rectangular or substantially rectangular opening provided at the center of the connecting portion 14b. The external terminal 16a is exposed to the outside through the opening Ha. The opening Hb is a rectangular or substantially rectangular opening provided at a side of the opening Ha which is on the positive direction side of the y-axis direction. The opening Hc is a rectangular or substantially rectangular opening provided at a side of the opening Ha which is on the negative direction side of the x-axis direction. The opening Hd is a rectangular or substantially rectangular opening provided at a side of the opening Ha which is on the negative direction side of the y-axis direction. The terminal portion 22b is exposed to the outside through the openings Hb to Hd so as to function as an external terminal.

The connecting portion 14c is connected with an end of the line portion 14a which is on the positive direction side of the x-axis direction and covers the front surface of the connecting portion 18a-c. Note that, however, the connecting portion 14c includes openings He to Hh. The opening He is a rectangular or substantially rectangular opening provided at the center of the connecting portion 14c. The external terminal 16b is exposed to the outside through the opening He. The opening Hf is a rectangular or substantially rectangular opening provided at a side of the opening He which is on the positive direction side of the y-axis direction. The opening Hg is a rectangular or substantially rectangular opening provided at a side of the opening He which is on the positive direction side of the x-axis direction. The opening Hh is a rectangular or substantially rectangular opening provided at a side of the opening He which is on the negative direction side of the y-axis direction. The terminal portion 22c is exposed to the outside through the openings Hf to Hh so as to function as an external terminal.

The connectors 100a, 100b are mounted onto the front surfaces of the connecting portions 12b, 12c, respectively.

Since the connectors 100a, 100b have the same configuration, the following description is provided with an example of the configuration of the connector 100b.

The connector 100b includes a connector main body 102, external terminals 104, 106, a center conductor 108, and an external conductor 110 as shown in FIG. 1 and FIG. 5. The connector main body 102 has such a shape that a cylinder is joined to a rectangular or substantially rectangular plate. The connector main body 102 is made of an insulating material, such as a resin.

The external terminal 104 is provided at a position on a surface of the plate of the connector main body 102 which is on the negative direction side of the z-axis direction so as to oppose the external terminal 16b. The external terminal 106 is provided at a position on the surface of the plate of the connector main body 102 which is on the negative direction side of the z-axis direction so as to correspond to the terminal portion 22c that is exposed through the openings Hf to Hh.

The center conductor 108 is provided at the center of the cylinder of the connector main body 102 and is connected with the external terminal 104. The center conductor 108 is a signal terminal at which a high frequency signal is input or output. The external conductor 110 is provided on the inner perimeter surface of the cylinder of the connector main body 102 and is connected with the external terminal 106. The external conductor 110 is a ground terminal which is maintained at the ground potential.

The connector 100b, which is configured as described above, is mounted onto the front surface of the connecting portion 12c such that the external terminal 104 is connected with the external terminal 16b, and the external terminal 106 is connected with the terminal portion 22c. Accordingly, the signal line 20 is electrically coupled to the center conductor 108. Meanwhile, the ground conductors 22, 24, 26 are electrically coupled to the external conductor 110.

Figure 6A:
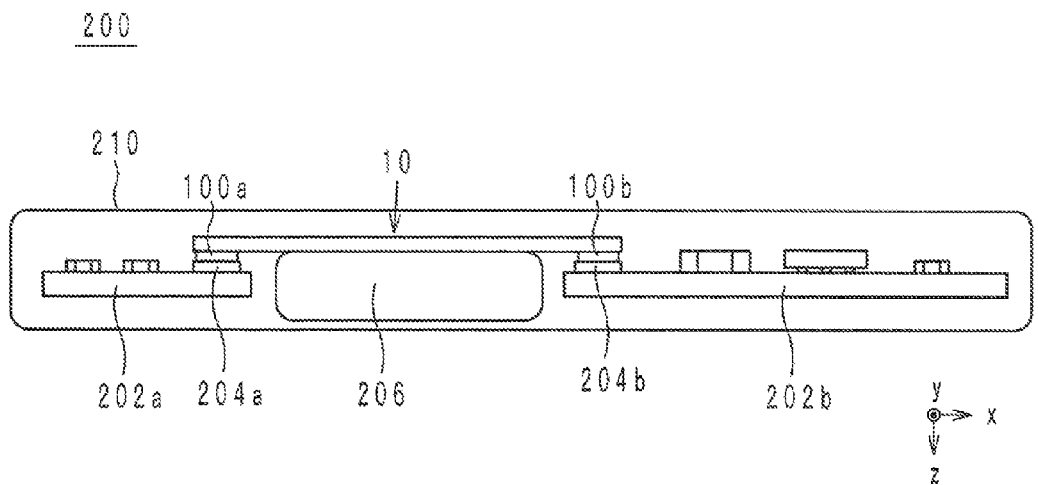
FIGS. 6A and 6B shows views of an electronic device in which a high frequency signal line is used, which are viewed in plan from the y-axis direction and the z-axis direction.
Figure 6B:
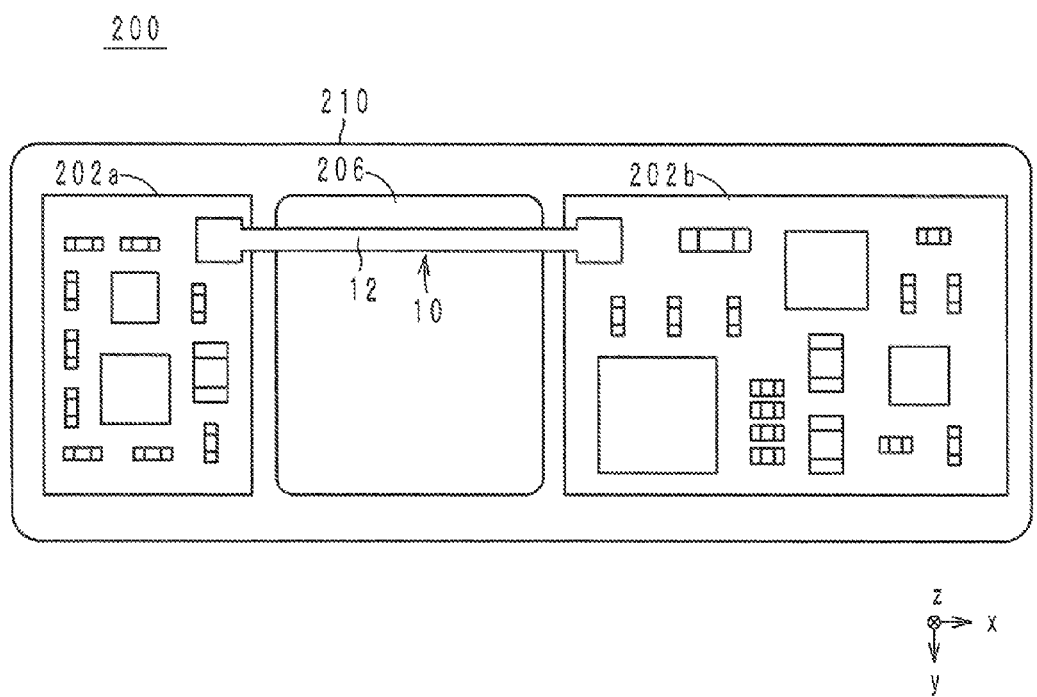

The high frequency signal line 10 preferably is to be used as described below. FIG. 6 shows views of an electronic device 200 that uses the high frequency signal line 10, which are viewed in plan from the y-axis direction and the z-axis direction.

The electronic device 200 includes the high frequency signal line 10, circuit boards 202a, 202b, receptacles 204a, 204b, a battery pack (metal body) 206, and a case 210.

The circuit board 202a includes, for example, a transmission circuit or reception circuit which includes an antenna. The circuit board 202b includes, for example, a power supply circuit. The battery pack 206 is, for example, a lithium ion rechargeable battery and has a structure whose surface is covered with a metal cover. The circuit board 202a, the battery pack 206, and the circuit board 202b are arranged in this order from the negative direction side to the positive direction side of the x-axis direction.

The receptacles 204a, 204b are respectively provided on principal surfaces of the circuit boards 202a, 202b which are on the negative direction side of the z-axis direction. The receptacles 204a, 204b are connected with the connectors 100a, 100b, respectively. With this arrangement, a high frequency signal transmitted between the circuit boards 202a, 202b, which has a frequency of 2 GHz, for example, is applied to the center conductor 108 of the connectors 100a, 100b via the receptacles 204a, 204b. The external conductors 110 of the connectors 100a, 100b are maintained at the ground potential via the circuit boards 202a, 202b and the receptacles 204a, 204b. With this arrangement, the high frequency signal line 10 is provided between the circuit boards 202a, 202b so as to couple the circuit boards 202a, 202b.

Here, the front surface of the dielectric element assembly 12 (more precisely, the protection layer 14) is in contact with the battery pack 206. The front surface of the dielectric element assembly 12 and the battery pack 206 are secured to each other preferably using an adhesive agent or the like. The front surface of the dielectric element assembly 12 is a principal surface which is positioned on the ground conductor side relative to the signal line 20. Thus, the ground conductor 22 which has a flattened shape is present between the signal line 20 and the battery pack 206.

Hereinafter, a non-limiting example of a manufacturing method of the high frequency signal line 10 is described with reference to FIG. 2. The following description is provided with an example where a single high frequency signal line 10 is manufactured, although in actuality large-size dielectric sheets are stacked and cut, such that a plurality of high frequency signal lines 10 are simultaneously manufactured.

First, the dielectric sheets 18 which are made of a thermoplastic resin whose entire surface is covered with a copper foil are provided. The surface of the copper foil of the dielectric sheets 18 preferably is, for example, plated with zinc for anticorrosion such that it is smoothed. The thickness of the copper foil preferably is about 10 µm to about 20 µm, for example.

Then, a photolithography process is carried out to form the external terminals 16 and the ground conductor 22 shown in FIG. 2 on the front surface of the dielectric sheet 18a. Specifically, a resist layer which has the same shape as the external terminals 16 (16a, 16b) and the ground conductor 22 shown in FIG. 2 is printed on the copper foil of the dielectric sheet 18a. Then, etching is carried out on the copper foil such that portions of the copper foil which are not covered with the resist layer are removed. Thereafter, the resist layer is removed. As a result, the external terminals 16 and the ground conductor 22 are formed on the front surface of the dielectric sheet 18a as shown in FIG. 2.

Then, a photolithography process is carried out to form the signal line 20 shown in FIG. 2 on the front surface of the dielectric sheet 18b. Also, a photolithography process is carried out to form the ground conductors 24, 26 and the terminal portions 28b, 28c shown in FIG. 2 on the front surface of the dielectric sheet 18c. Note that these photolithography processes are the same as the photolithography process that is carried out for formation of the external terminals 16 and the ground conductor 22, and therefore, the description thereof is herein omitted.

Then, portions of the dielectric sheets 18a, 18b in which the via hole conductors b1, b2, B1 to B4 are to be formed are irradiated with a laser beam from the rear surface side such that through holes are formed. Thereafter, the through holes formed in the dielectric sheets 18a, 18b are filled with an electrically-conductive paste.

Then, the dielectric sheets 18a to 18c are stacked in this order from the positive direction side to the negative direction side of the z-axis direction. And, heat and pressure are applied to the dielectric sheets 18a to 18c from the positive direction side and the negative direction side of the z-axis direction such that the dielectric sheets 18a to 18c are softened, and pressure-bonded and integrated, while the electrically-conductive paste in the through holes is solidified, such that the via hole conductors b1, b2, B1 to B4 shown in FIG. 2 are formed. Note that the dielectric sheets 18 may be integrated using an adhesive agent such as an epoxy-based resin instead of thermocompression bonding. Alternatively, the via hole conductors b1, b2, B1 to B4 may be realized by forming through holes after integration of the dielectric sheets 18 and then filling the through holes with an electrically-conductive paste or forming a plating film in the through holes. Note that the via hole conductor refers not only to a through hole which is entirely filled with a conductor, but also to a through hole which is not entirely filled with a conductor and the inner perimeter surface of which is covered with the conductor.

Lastly, a resin (resist) paste is applied to form the protection layer 14 on the dielectric sheet 18a. As a result, the high frequency signal line 10 shown in FIG. 1 is obtained.

Figure 7:
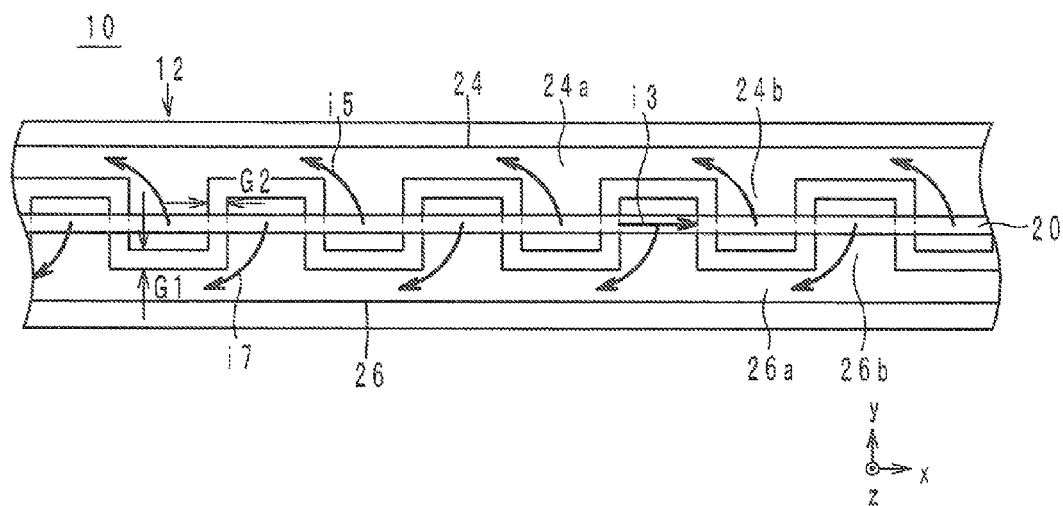
FIG. 7 is a view of a high frequency signal line, which is viewed in plan from the z-axis direction.
Figure 8:
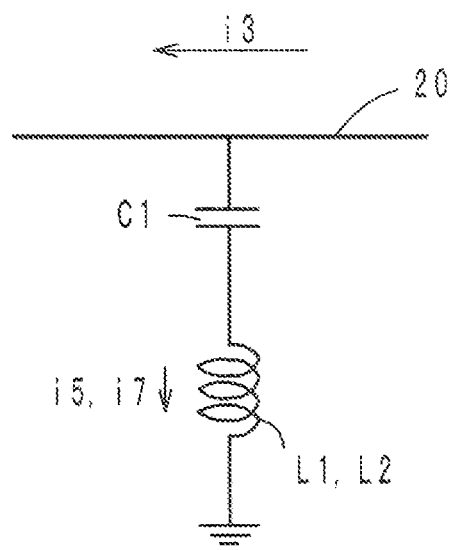
FIG. 8 is an equivalent circuit diagram of a signal line and ground conductors.

According to the high frequency signal line 10 of the present preferred embodiment, the thickness of the high frequency signal line 10 is significantly reduced. FIG. 7 is a view of the high frequency signal line 10, which is viewed in plan from the z-axis direction. FIG. 8 is an equivalent circuit diagram of the signal line 20 and the ground conductors 24, 26.

Figure 16:
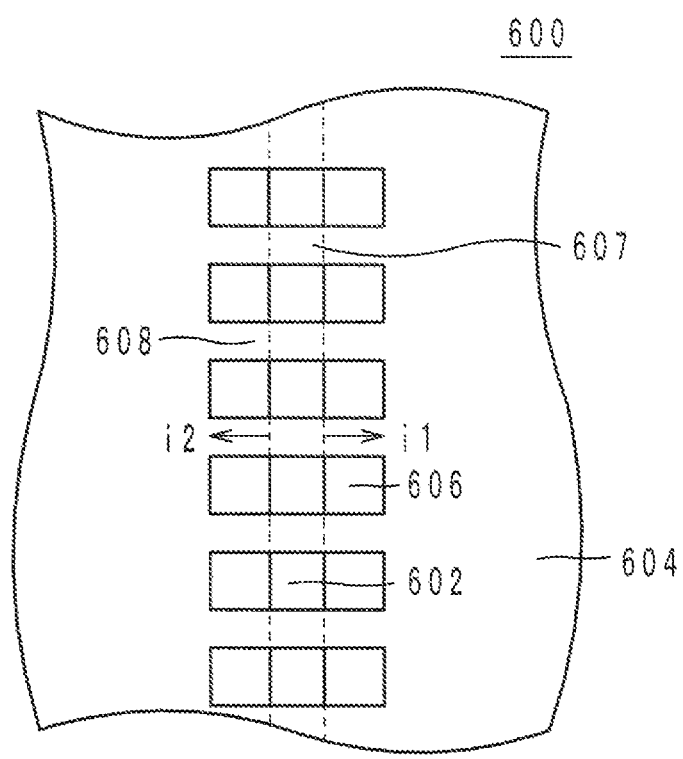
FIG. 16 is a view of a flexible substrate described in Japanese Laid-Open Publication No. 2007-123740, which is viewed in plan from the layer-stacking direction.
Figure 17:
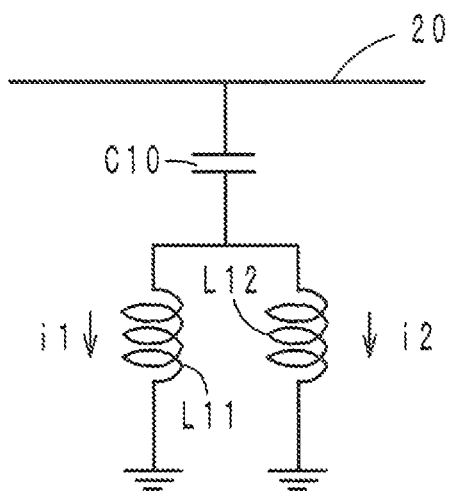
FIG. 17 is an equivalent circuit diagram of a signal line and a ground conductor layer.

In the flexible substrate 600 described in Japanese Laid-Open Publication No. 2007-123740, when a high frequency signal flows through the signal line 602, electric currents i1, i2 flow through the bridge portions 608 lying between the openings 606 of the ground layer 604 due to electromagnetic induction as shown in FIG. 16. The electric currents i1, i2 flow in mutually opposite directions from a center of the bridge portions 608 in terms of the y-axis direction. Here, the ground layer 604 of the flexible substrate 600 has a circuit configuration shown in FIG. 17. More specifically, the right half of the bridge portions 608 defines an inductor component L11, and the left half of the bridge portions 608 defines an inductor component L12. Also, a capacitor component C10 is located between the signal line 602 and the ground layer 604. When the electric current i1 flows through the inductor component L11 and the electric current i2 flows through the inductor component L12, a magnetic field produced by the inductor component L11 and a magnetic field produced by the inductor component L12 cancel each other because the direction of the electric current i1 and the direction of the electric current i2 are opposite to each other. As a result, in the equivalent circuit diagram shown in FIG. 17, the inductor components L11, L12 are not present, or the inductor components significantly decrease. Therefore, the characteristic impedance of a portion of the signal line 602 overlapping the bridge portions 608 is such that the capacitor component C10 is dominant, and the characteristic impedance of that portion is lower than a predetermined characteristic impedance. In view of the foregoing, in the flexible substrate 600 described in Japanese Laid-Open Publication No. 2007-123740, it is necessary to increase the distance between the signal line 602 and the ground layer 604. Thus, it is difficult to reduce the thickness of the flexible substrate 600.

On the other hand, the high frequency signal line 10 includes the main body portions 24a, 26a and the protruding portions 24b, 26b. When viewed in plan from the z-axis direction, the main body portions 24a, 26a extend along the signal line 20 on the positive direction side and the negative direction side, respectively, of the y-axis direction relative to the signal line 20. When viewed in plan from the z-axis direction, the protruding portions 24b, 26b are protruding from the main body portions 24a, 26a, respectively, toward the signal line 20 and overlapping the signal line 20. Further, the protruding portions 24b are not connected with the ground conductor 26, and the protruding portions 26b are not connected with the ground conductor 24. As a result, the signal line 20 and the ground conductors 24, 26 of the high frequency signal line 10 have the circuit configuration shown in FIG. 8. More specifically, the protruding portions 24b, 26b define the inductor components L1, L2, respectively. Since the protruding portions 24b, 26b are not connected with the ground conductors 26, 24, respectively, the protruding portions 24b, 26b do not define any other inductor component than the inductor components L1, L2. Meanwhile, a capacitor component C1 is located between the signal line 20 and the ground conductors 24, 26. The inductor components L1, L2 and the capacitor component C1 are connected in series.

Here, when the electric current i3 flows through the signal line 20 toward the positive direction side of the x-axis direction, electric currents flow through the ground conductors 24, 26 toward the negative direction side of the x-axis direction due to electromagnetic induction. Meanwhile, an electric current i5 flows through the protruding portions 24b toward the positive direction side of the y-axis direction. That is, the electric current i5 flows through the inductor component L1. Note that, however, an electric current whose direction is opposite to the electric current i5 would not flow through the protruding portions 24b because the protruding portions 24b are not connected with the ground conductor 26. Therefore, a magnetic field produced by the inductor component L1 would not be canceled. Meanwhile, an electric current i7 flows through the protruding portions 26b toward the positive direction side of the y-axis direction. That is, the electric current i7 flows through the inductor component L2. Note that, however, an electric current whose direction is opposite to the electric current i7 would not flow through the protruding portions 26b because the protruding portions 26b are not connected with the ground conductor 24. Therefore, a magnetic field produced by the inductor component L2 would not be canceled. Note that the same phenomenon also occurs when an electric current whose direction is opposite to the electric current i3 flows through the signal line 20. As a result, the characteristic impedance of the signal line 20 is such that the inductor components L1, L2 and the capacitor component C1 are dominant, and the characteristic impedance of the signal line 20 is matched to a predetermined characteristic impedance (e.g., about 50Ω). As a result, in the high frequency signal line 10, it is not necessary to increase the distance in the z-axis direction between the signal line 20 and the ground conductors 24, 26 as is necessary in the flexible substrate 600 described in Japanese Laid-Open Publication No. 2007-123740, and therefore, the thickness of the high frequency signal line 10 can be significantly reduced. Alternatively, the line width of the signal line 20 can be increased, instead of reducing the thickness of the high frequency signal line 10.

Also, the high frequency signal line 10 prevents the occurrence of unwanted radiation. More specifically, in the high frequency signal line 10, the total of the distance L1 from a portion where the signal line 20 and the protruding portions 24b overlap each other to the via hole conductors B1, B3, the length L2 of the via hole conductors B1, B3, the distance L3 from the via hole conductors B1, B3 to the via hole conductors B2, B4, the length L4 of the via hole conductors B2, B4, and the distance L5 from the via hole conductors B2, B4 to a portion where the signal line 20 and the protruding portions 26b that are adjacent to the protruding portions 24b overlap each other is equal or substantially equal to ¼ of the wavelength of a high frequency signal transmitted through the signal line 20. With this arrangement, the potential difference between the protruding portions 24b and the protruding portions 26b which are adjacent to each other is the maximum. As a result, a strong electric field is produced between the protruding portions 24b and the protruding portions 26b. Thus, an electric field from the signal line 20 extends to the protruding portions 24b, 26b without being radiated from the gaps between the protruding portions 24b and the protruding portions 26b to the outside of the high frequency signal line 10. As a result, in the high frequency signal line 10, the occurrence of unwanted radiation is prevented.

First Variation

Figure 9:
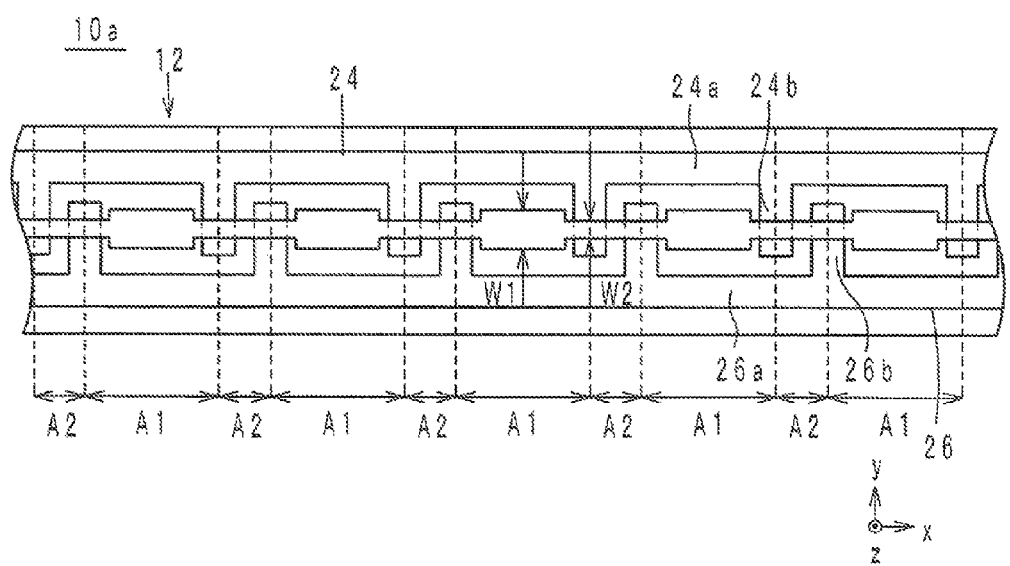
FIG. 9 is a view of a high frequency signal line according to the first variation of a preferred embodiment of the present invention, which is viewed in plan from the z-axis direction.

Hereinafter, a high frequency signal line according to the first variation of a preferred embodiment of the present invention is described with reference to the drawings. FIG. 9 is a view of a high frequency signal line 10a according to the first variation, which is viewed in plan from the z-axis direction.

In the high frequency signal line 10a, regions A1 in which the protruding portions 24b, 26b are provided relatively sparsely and regions A2 in which the protruding portions 24b, 26b are provided relatively densely are arranged periodically in the x-axis direction along the signal line 20. The line width W1 of the signal line 20 in the regions A1 is greater than the line width W2 of the signal line 20 in the regions A2.

In the regions A2, the distance between the protruding portions 24b, 26b is relatively small, while in the regions A1 the distance between the protruding portions 24b, 26b is relatively large. Accordingly, in the regions A1, the protruding portions 24b, 26b are provided relatively sparsely, while in the regions A2 the protruding portions 24b, 26b are provided relatively densely. Thus, in the regions A1, the electrostatic capacitance between the signal line 20 and the ground conductors 24, 26 is relatively small, and the characteristic impedance of the signal line 20 is relatively high. Meanwhile, in the regions A2, the electrostatic capacitance between the signal line 20 and the ground conductors 24, 26 is relatively large, and the characteristic impedance of the signal line 20 is relatively low. Since the regions A1, A2 are arranged alternately in the x-axis direction, the characteristic impedance of the signal line 20 periodically varies.

As described hereinabove, when the characteristic impedance of the signal line 20 periodically varies, the occurrence of unwanted radiation is prevented. More specifically, in the high frequency signal line, when the signal line has a constant characteristic impedance, a standing wave which has a relatively long wavelength occurs with both ends of a signal line whose characteristic impedance is high serving as nodes. The standing wave which has a relatively long wavelength has a relatively low frequency. When such a relatively low frequency is lower than the frequency of a high frequency signal transmitted through the high frequency signal line, unwanted radiation at the relatively low frequency is generated from the high frequency signal line.

In view of the above, in the high frequency signal line 10, the regions A1 in which the characteristic impedance is relatively high and the regions A2 in which the characteristic impedance is relatively low are provided. Therefore, the regions A1 serve as nodes of a standing wave. Accordingly, the wavelength of a standing wave which can occur in the signal line 20 is twice the distance between the adjacent regions A1. As a result, the frequency of a standing wave which can occur in the signal line 20 is relatively high. Thus, by sufficiently shortening the interval of the regions A1 of the signal line 20, the frequency of a standing wave which can occur in the signal line 20 can be higher than the frequency of a high frequency signal transmitted through the high frequency signal line 10. Accordingly, even when a high frequency signal is transmitted through the high frequency signal line 10, the occurrence of unwanted radiation from the high frequency signal line 10 is prevented. Note that, to more effectively prevent the occurrence of unwanted radiation from the high frequency signal line 10, the interval of the regions A1 of the signal line 20 (i.e., the ground conductor 24) is preferably shorter than a half of the wavelength of a high frequency signal transmitted through the high frequency signal line 10.

In the high frequency signal line 10, the line width W1 of the signal line 20 in the regions A1 is greater than the line width W2 of the signal line 20 in the regions A2. In the regions A1, the protruding portions 24b, 26b are provided relatively sparsely, and therefore, the electrostatic capacitance generated between the protruding portions 24b, 26b and the signal line 20 is relatively small. Thus, even when the line width W1 of the signal line 20 is varied, the electrostatic capacitance generated between the protruding portions 24b, 26b and the signal line 20 hardly varies, and the characteristic impedance of the signal line 20 also hardly varies. In view of such, the line width W1 of the signal line 20 is increased, such that the direct current resistance of the signal line 20 can be reduced without causing a large variation in the characteristic impedance of the signal line 20.

Note that the other components of the high frequency signal line 10a preferably are the same as those of the high frequency signal line 10, and therefore, the descriptions thereof are herein omitted.

Second Variation

Figure 10:
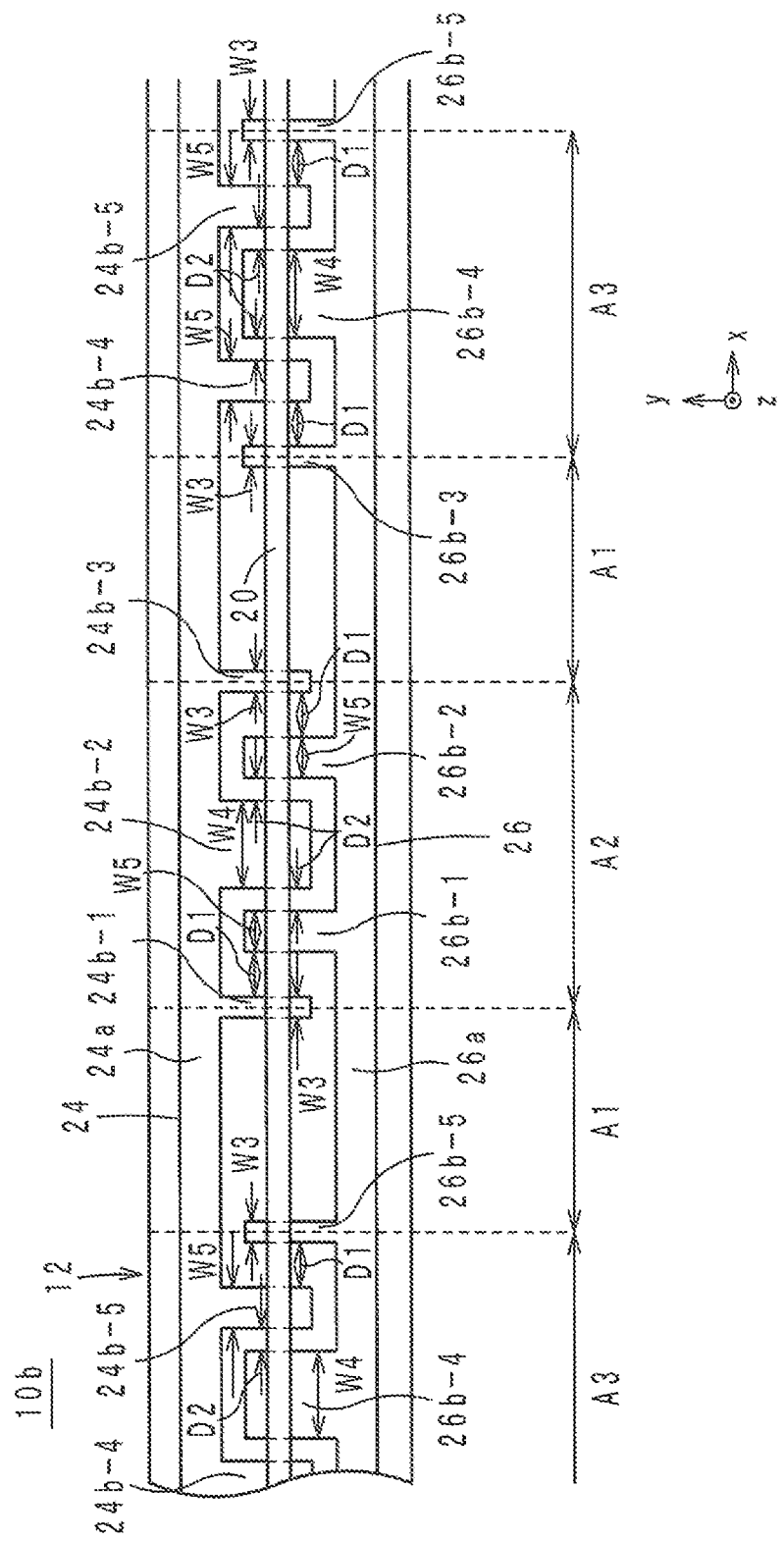
FIG. 10 is a view of a high frequency signal line according to the second variation of a preferred embodiment of the present invention, which is viewed in plan from the z-axis direction.

Hereinafter, a high frequency signal line according to the second variation of a preferred embodiment of the present invention is described with reference to the drawings. FIG. 10 is a view of a high frequency signal line 10b according to the second variation, which is viewed in plan from the z-axis direction.

In the high frequency signal line 10b, regions A1 in which the protruding portions 24b, 26b are provided relatively sparsely and regions A2, A3 in which the protruding portions 24b, 26b are provided relatively densely are arranged periodically in the x-axis direction along the signal line 20.

In the region A2, protruding portions 24b-1, 26b-1, 24b-2, 26b-2, 24b-3 are arranged in this order in the x-axis direction. The distance D1 between the protruding portions 24b-1, 26b-1 and the distance D1 between the protruding portions 26b-2, 24b-3 are greater than the distance D2 between the protruding portions 26b-1, 24b-2 and the distance D2 between the protruding portions 24b-2, 26b-2. Further, the width W3 of the protruding portions 24b-1, 24b-3 is narrower than the width W5 of the protruding portions 26b-1, 26b-2, and the width W5 of the protruding portions 26b-1, 26b-2 is narrower than the width W4 of the protruding portion 24b-2. Thus, in the region A2, at positions closer to both ends in the x-axis direction, the protruding portions have smaller widths, and the distance between the protruding portions is larger. As a result, in the region A2, at positions closer to both ends in the x-axis direction, the electrostatic capacitance between the signal line 20 and the ground conductors 24, 26 is smaller, and therefore, the characteristic impedance of the signal line 20 is higher. Further, in the region A2, at positions closer to both ends in the x-axis direction, the inductor components of the ground conductors 24, 26 are larger, and therefore, the characteristic impedance of the signal line 20 is higher.

In the regions A3, protruding portions 26b-3, 24b-4, 26b-4, 24b-5, 26b-5 are arranged in this order in the x-axis direction. The distance D1 between the protruding portions 26b-3, 24b-4 and the distance D1 between the protruding portions 24b-5, 26b-5 are greater than the distance D2 between the protruding portions 24b-4, 26b-4 and the distance D2 between the protruding portions 26b-4, 24b-5. Further, the width W3 of the protruding portions 26b-3, 26b-5 is narrower than the width W5 of the protruding portions 24b-4, 24b-5, and the width W5 of the protruding portions 24b-4, 24b-5 is narrower than the width W4 of the protruding portion 26b-4. Thus, in the regions A3, at positions closer to both ends in the x-axis direction, the protruding portions have smaller widths, and the distance between the protruding portions is larger. As a result, in the regions A3, at positions closer to both ends in the x-axis direction, the electrostatic capacitance between the signal line 20 and the ground conductors 24, 26 is smaller, and therefore, the characteristic impedance of the signal line 20 is higher. Further, in the regions A3, at positions closer to both ends in the x-axis direction, the inductor components of the ground conductors 24, 26 are larger, and therefore, the characteristic impedance of the signal line 20 is higher.

As described above, in the high frequency signal line 10b, the characteristic impedance of the signal line 20 is not constant but varies stepwise in the regions A2, A3. As a result, the characteristic impedance of the signal line 20 is prevented from sharply varying at the boundaries between the regions A1 and the region A2 and the boundaries between the regions A1 and the regions A3. As a result, reflection of a high frequency signal at the boundaries between the regions A1 and the region A2 and the boundaries between the regions A1 and the regions A3 is prevented.

Note that the other components of the high frequency signal line 10b are preferably the same as those of the high frequency signal line 10, and therefore, the descriptions thereof are herein omitted.

Third Variation

Figure 11:
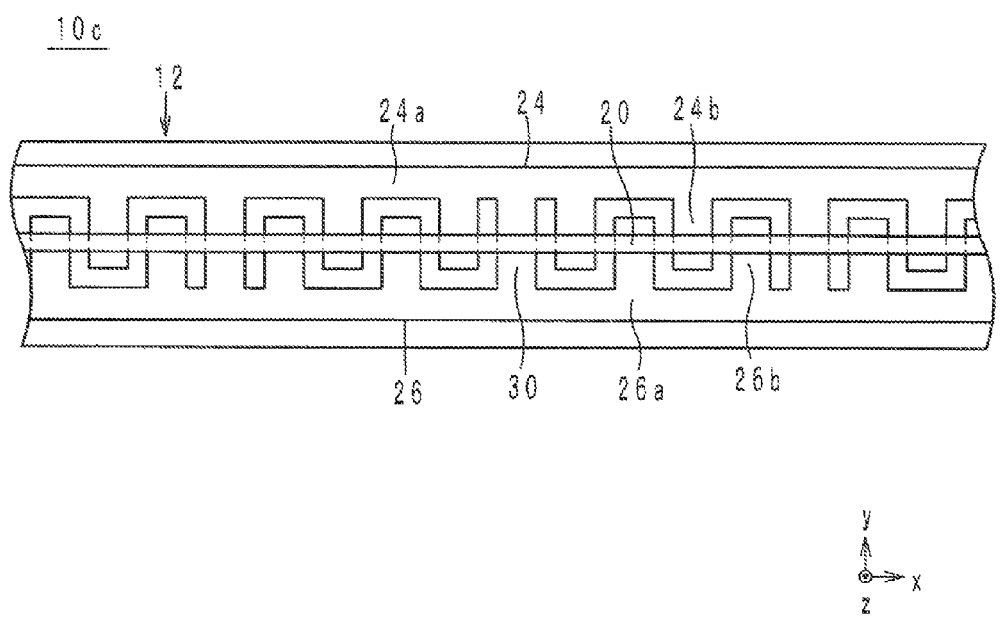
FIG. 11 is a view of a high frequency signal line according to the third variation of a preferred embodiment of the present invention, which is viewed in plan from the z-axis direction.

Hereinafter, a high frequency signal line according to the third variation of a preferred embodiment of the present invention is described with reference to the drawings. FIG. 11 is a view of a high frequency signal line 10c according to the third variation, which is viewed in plan from the z-axis direction.

As in the high frequency signal line 10c, the ground conductor 24 and the ground conductor 26 may be coupled by bridge portions 30.

Fourth Variation

Figure 12:
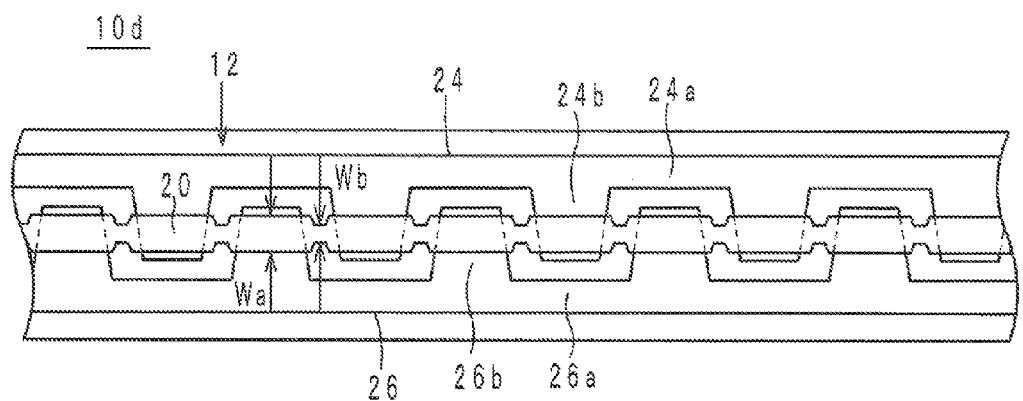
FIG. 12 is a view of a high frequency signal line according to the fourth variation of a preferred embodiment of the present invention, which is viewed in plan from the z-axis direction.

Hereinafter, a high frequency signal line according to the fourth variation of a preferred embodiment of the present invention is described with reference to the drawings. FIG. 12 is a view of a high frequency signal line 10d according to the fourth variation, which is viewed in plan from the z-axis direction.

In the high frequency signal line 10d, the protruding portions 24b, 26b have such a trapezoidal shape that the width decreases toward the end. By adjusting the shape of the protruding portions 24b, 26b in this way, the electrostatic capacitance generated between the signal line 20 and the protruding portions 24b, 26b can be adjusted. Note that the protruding portions 24b, 26b may have such a trapezoidal shape that the width increases toward the end.

In the high frequency signal line 10d, the line width Wa of the signal line 20 in a region where the protruding portion 24b, 26b is provided is greater than the line width Wb of the signal line 20 in a region where the protruding portion 24b, 26b is not provided. Accordingly, the electrostatic capacitance generated between the signal line 20 and the protruding portions 24b, 26b is large. By adjusting the line width of the signal line 20 in this way, the electrostatic capacitance generated between the signal line 20 and the protruding portions 24b, 26b can be adjusted.

Fifth Variation

Figure 13:
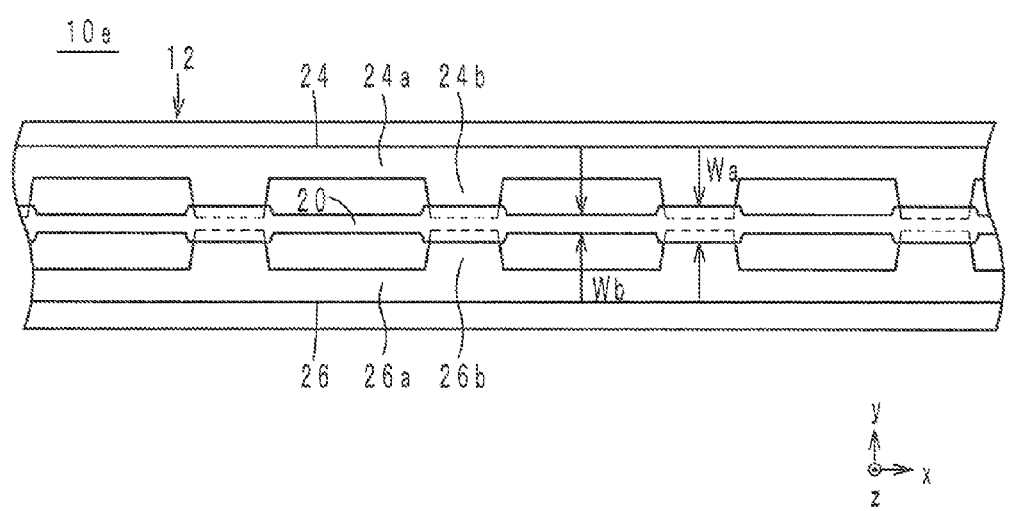
FIG. 13 is a view of a high frequency signal line according to the fifth variation of a preferred embodiment of the present invention, which is viewed in plan from the z-axis direction.

Hereinafter, a high frequency signal line according to the fifth variation of a preferred embodiment of the present invention is described with reference to the drawings. FIG. 13 is a view of a high frequency signal line 10e according to the fifth variation, which is viewed in plan from the z-axis direction.

In the high frequency signal line 10e, the protruding portions 24b, 26b are arranged so as to oppose each other in the y-axis direction. The line width Wa of the signal line 20 in a region where the protruding portions 24b, 26b are provided is greater than the line width Wb of the signal line 20 in a region where the protruding portions 24b, 26b are not provided. Accordingly, the protruding portions 24b, 26b overlap the signal line 20 while being arranged so as to oppose each other in the y-axis direction.

Sixth Variation

Figure 14:
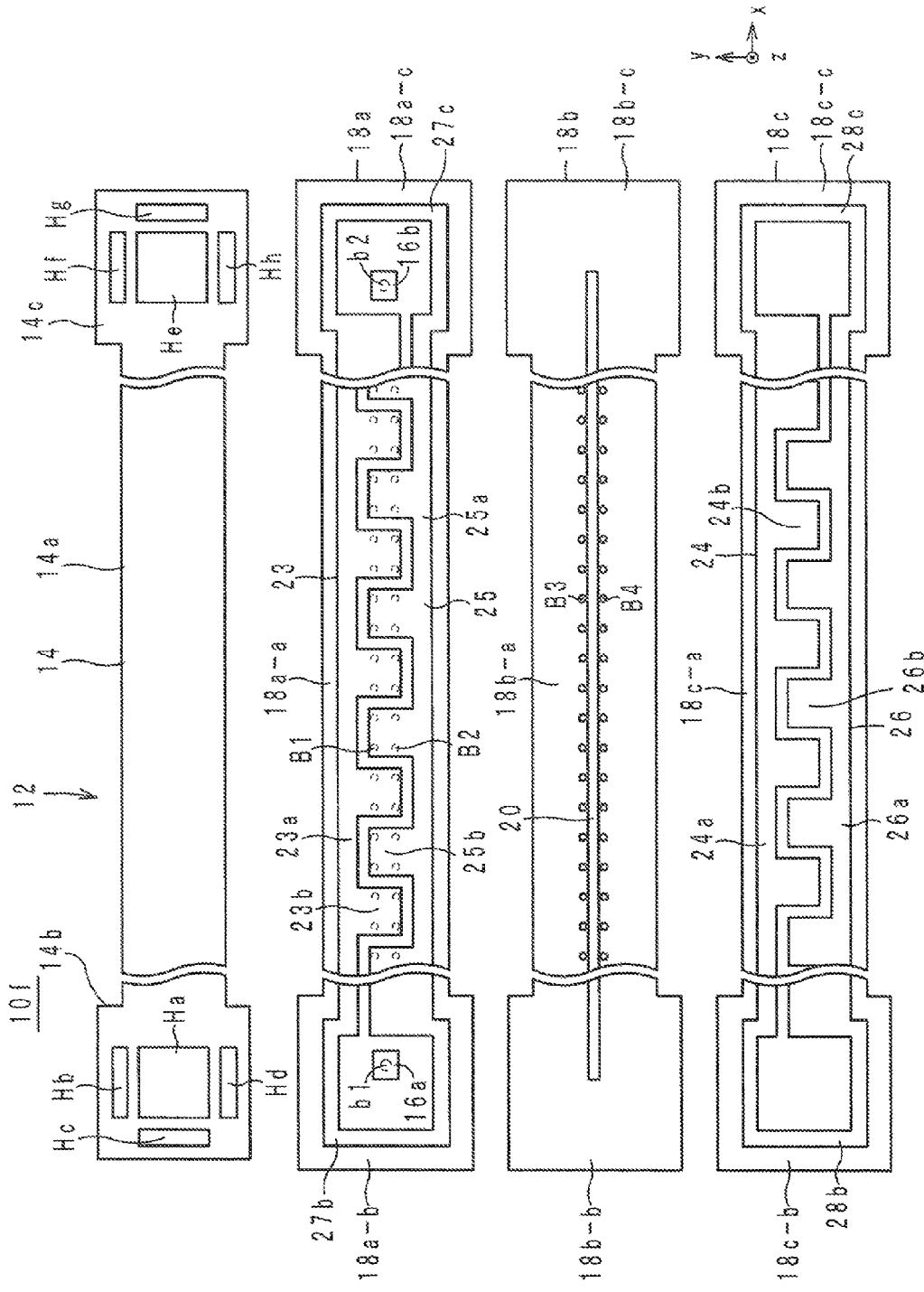
FIG. 14 is an exploded view of a high frequency signal line according to the sixth variation of a preferred embodiment of the present invention.
Figure 15:
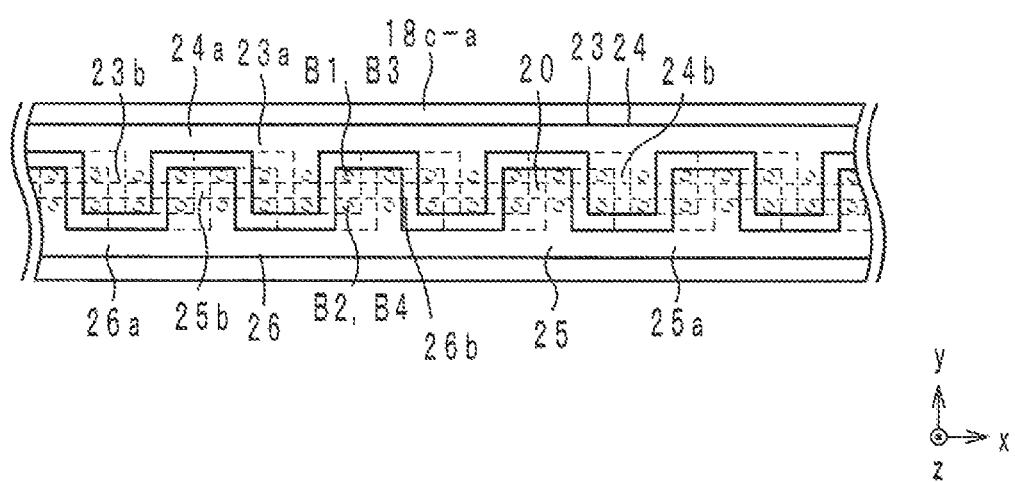
FIG. 15 is a view of the high frequency signal line according to the sixth variation of a preferred embodiment of the present invention, which is viewed in plan from the z-axis direction.

Hereinafter, a high frequency signal line according to the sixth variation of a preferred embodiment of the present invention is described with reference to the drawings. FIG. 14 is an exploded view of a high frequency signal line 10f according to the sixth variation. FIG. 15 is a view of the high frequency signal line 10f according to the sixth variation, which is viewed in plan from the z-axis direction.

The high frequency signal line 10f is different from the high frequency signal line 10 in that ground conductors 23, 25 which include protruding portions 23b, 25b, respectively, and terminal portions 27a, 27b are provided instead of the ground conductor 22 as shown in FIG. 14 and FIG. 15. The following description of the high frequency signal line 10f will be mainly focused on this difference.

The ground conductor 23 preferably has the same configuration as the ground conductor 24. The ground conductor 25 preferably has the same configuration as the ground conductor 26. The terminal portion 27a preferably has the same configuration as the terminal portion 28a. The terminal portion 27b preferably has the same configuration as the terminal portion 28b.

The ground conductors 23, 25 are displaced in the x-axis direction by a half period relative to the ground conductors 24, 26 as shown in FIG. 15. That is, a zigzag shaped gap lying between the ground conductor 23 and the ground conductor 25 and a zigzag shaped gap lying between the ground conductor 24 and the ground conductor 26 are displaced from each other in the x-axis direction by a half period.

The protruding portions 23b and the protruding portions 24b are coupled by two via hole conductors B1, B3 and two via hole conductors B2, B4. That is, the protruding portions 23b and the protruding portions 24b are coupled by four via hole conductors. Likewise, the protruding portions 25b and the protruding portions 26b are coupled by two via hole conductors B1, B3 and two via hole conductors B2, B4. That is, the protruding portions 25b and the protruding portions 26b are coupled by four via hole conductors.

According to the high frequency signal line 10f which has the above-described configuration, there is no gap at both ends in the y-axis direction of the signal line 20. That is, there is a gap only at either one of the ends in the y-axis direction of the signal line 20. Thus, the characteristic impedance of the signal line 20 is prevented from sharply varying.

Other Preferred Embodiments

The high frequency signal line according to the present invention is not limited to the high frequency signal lines 10, 10a to 10f according to the above-described preferred embodiments but can be modified within the scope of the spirit of the present invention.

Although in the above-described preferred embodiments both the ground conductors 24, 26 preferably are provided, only one of them may be provided. In this case also, reduction of the thickness is not hindered by undesirable reduction of the inductance component as is in the flexible substrate described in Japanese Laid-Open Publication No. 2007-123740. Therefore, the thickness of the high frequency signal line is significantly reduced. Note that, to more assuredly prevent occurrence of unwanted radiation, it is preferred that both the ground conductors 24, 26 are provided.

Note that the components shown in the high frequency signal lines 10, 10a to 10f may be combined.

Note that, in the high frequency signal line 10 of FIG. 1, the ground conductor 22 and the ground conductor 24 may have the same shape. The ground conductor 22 may have a ladder shape by providing a plurality of openings arranged along the signal line 20.

Note that the high frequency signal lines 10, 10a to 10f may be used as a high frequency signal line in a RF circuit board, such as an antenna front end module.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
a case; and
a high frequency signal line stored in the case; wherein
the high frequency signal line includes:
a element assembly including a plurality of stacked insulator layers;
a linear signal line provided in or on the element assembly; and
a first ground conductor provided in or on the element assembly on one side of a layer-stacking direction relative to the signal line, the first ground conductor being arranged so as to oppose the signal line via the insulator layers;
the first ground conductor includes:
a first main body portion extending along the signal line on one side of a direction perpendicular or substantially perpendicular to the signal line relative to the signal line when viewed in plan from the layer-stacking direction; and
a first protruding portion protruding from the first main body portion toward the signal line and overlapping the signal line when viewed in plan from the layer-stacking direction, the first protruding portion being not connected with any other conductor than the first main body portion.

2. The electronic device according to claim 1, wherein the high frequency signal line further comprises a second ground conductor provided in or on the element assembly on one side of a layer-stacking direction relative to the signal line, the second ground conductor being arranged so as to oppose the signal line via the insulator layers; wherein
the first protruding portion is not connected with the second ground conductor; and
the second ground conductor includes:
a second main body portion extending along the signal line on the other side of the direction perpendicular or substantially perpendicular to the signal line relative to the signal line when viewed in plan from the layer-stacking direction; and
a second protruding portion protruding from the second main body portion toward the signal line and overlapping the signal line when viewed in plan from the layer-stacking direction, the second protruding portion being not connected with the first ground conductor.

3. The electronic device according to claim 2, wherein the first protruding portion and the second protruding portion are alternately arranged along the signal line.

4. The electronic device according to claim 2, wherein a first region in which the first protruding portion and the second protruding portion are provided relatively densely and a second region in which the first protruding portion and the second protruding portion are provided relatively sparsely are arranged periodically along the signal line.

5. The electronic device according to claim 2, further comprising:
a third ground conductor provided in or on the element assembly on the other side of a layer-stacking direction relative to the signal line, the third ground conductor being arranged so as to oppose the signal line via the insulator layers;
a first via hole conductor arranged to couple the first ground conductor and the third ground conductor; and
a second via hole conductor arranged to couple the second ground conductor and the third ground conductor.

6. The electronic device according to claim 5, wherein
the first via hole conductor is provided on one side of the direction perpendicular or substantially perpendicular to the signal line relative to the first protruding portion;
the second via hole conductor is provided on the other side of the direction perpendicular or substantially perpendicular to the signal line relative to the second protruding portion;
a total of a distance from a portion where the signal line and the first protruding portion overlap each other to the first via hole conductor, a length of the first via hole conductor, a distance from the first via hole conductor to the second via hole conductor, a length of the second via hole conductor, and a distance from the second via hole conductor to a portion where the signal line and the second protruding portion that is adjacent to the first protruding portion overlap each other is equal or substantially equal to ¼ of a wavelength of a high frequency signal transmitted through the signal line.

7. A high frequency signal line comprising:
a element assembly including a plurality of stacked insulator layers;
a linear signal line provided in or on the element assembly; and
a first ground conductor provided in or on the element assembly on one side of a layer-stacking direction relative to the signal line, the first ground conductor being arranged so as to oppose the signal line via the insulator layers; wherein
the first ground conductor includes:
a first main body portion extending along the signal line on one side of a direction perpendicular or substantially perpendicular to the signal line relative to the signal line when viewed in plan from the layer-stacking direction; and
a first protruding portion protruding from the first main body portion toward the signal line and overlapping the signal line when viewed in plan from the layer-stacking direction, the first protruding portion being not connected with any conductor other than the first main body portion.

8. The high frequency signal line according to claim 7, further comprising a second ground conductor provided in or on the element assembly on one side of a layer-stacking direction relative to the signal line, the second ground conductor being arranged so as to oppose the signal line via the insulator layers; wherein
the first protruding portion is not connected with the second ground conductor; and
the second ground conductor includes:
a second main body portion extending along the signal line on the other side of the direction perpendicular or substantially perpendicular to the signal line relative to the signal line when viewed in plan from the layer-stacking direction; and a second protruding portion protruding from the second main body portion toward the signal line and overlapping the signal line when viewed in plan from the layer-stacking direction, the second protruding portion being not connected with the first ground conductor.

9. The high frequency signal line according to claim 8, wherein the first protruding portion and the second protruding portion are alternately arranged along the signal line.

10. The high frequency signal line according to claim 8, wherein a first region in which the first protruding portion and the second protruding portion are provided relatively densely and a second region in which the first protruding portion and the second protruding portion are provided relatively sparsely are arranged periodically along the signal line.

11. The high frequency signal line according to claim 8, further comprising:

a third ground conductor provided in or on the element assembly on the other side of a layer-stacking direction relative to the signal line, the third ground conductor being arranged so as to oppose the signal line via the insulator layers;

a first via hole conductor arranged to couple the first ground conductor and the third ground conductor; and a second via hole conductor arranged to couple the second ground conductor and the third ground conductor.

12. The high frequency signal line according to claim 11, wherein the first via hole conductor is provided on one side of the direction perpendicular or substantially perpendicular to the signal line relative to the first protruding portion;

the second via hole conductor is provided on the other side of the direction perpendicular or substantially perpendicular to the signal line relative to the second protruding portion;

a total of a distance from a portion where the signal line and the first protruding portion overlap each other to the first via hole conductor, a length of the first via hole conductor, a distance from the first via hole conductor to the second via hole conductor, a length of the second via hole conductor, and a distance from the second via hole conductor to a portion where the signal line and the second protruding portion that is adjacent to the first protruding portion overlap each other is equal or substantially equal to ¼ of a wavelength of a high frequency signal transmitted through the signal line.

* * * * *